(12) United States Patent
Tanaka et al.

(10) Patent No.: US 7,737,053 B2
(45) Date of Patent: Jun. 15, 2010

(54) SEMICONDUCTOR DEVICE AND MANUFACTURING METHOD OF THE SAME

(75) Inventors: Koichiro Tanaka, Isehara (JP); Yoshiaki Yamamoto, Hadano (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 354 days.

(21) Appl. No.: 10/579,239

(22) PCT Filed: Nov. 16, 2005

(86) PCT No.: PCT/JP2005/021397

§ 371 (c)(1),
(2), (4) Date: May 12, 2006

(87) PCT Pub. No.: WO2006/054758

PCT Pub. Date: May 26, 2006

(65) Prior Publication Data

US 2007/0087458 A1 Apr. 19, 2007

(30) Foreign Application Priority Data

Nov. 18, 2004 (JP) .............................. 2004-334190

(51) Int. Cl.
H01L 21/00 (2006.01)
(52) U.S. Cl. ...................... 438/795; 438/510
(58) Field of Classification Search .................. 438/795; 257/E21.134
See application file for complete search history.

(56) References Cited

U.S. PATENT DOCUMENTS

| | | | |
|---|---|---|---|
| 6,380,044 B1 | 4/2002 | Talwar et al. | |
| 6,559,015 B1 * | 5/2003 | Yu | ............................. 438/301 |
| 6,642,122 B1 | 11/2003 | Yu | |
| 6,703,281 B1 | 3/2004 | Yu | |

(Continued)

FOREIGN PATENT DOCUMENTS

JP 2001-308344 11/2001

(Continued)

OTHER PUBLICATIONS

Machine translation of JP2001-308344.*

(Continued)

*Primary Examiner*—Bradley K Smith
(74) *Attorney, Agent, or Firm*—Eric J. Robinson; Robinson Intellectual Property Law Office, P.C.

(57) ABSTRACT

An RTA method has a limitation on miniaturization. The RTA method needs a heating time of several seconds, and has a risk that impurities are diffused into a deep portion, since a semiconductor substrate is heated at a high temperature. Thus, the RTA method has a difficulty in responding miniaturization which is expected in the future. According to the present invention, a fundamental wave is used without putting laser light into a non-linear optical device, and laser annealing is conducted by irradiating an impurity diffusion layer with pulsed laser light having high intensity and a high repetition rate, so as to electrically activate the impurities. By the present invention, a thin layer on the surface of a silicon substrate can be partially melted to conduct activation. Further, the width of the region activated by laser-scanning once can be increased, and thus the productivity can be enhanced dramatically.

11 Claims, 10 Drawing Sheets

U.S. PATENT DOCUMENTS

| | | |
|---|---|---|
| 6,743,687 B1 | 6/2004 | Yu |
| 6,743,689 B1 | 6/2004 | Paton et al. |
| 6,869,865 B2 | 3/2005 | Maegawa et al. |
| 2002/0018288 A1* | 2/2002 | Rieger et al. ............... 359/342 |
| 2002/0086502 A1 | 7/2002 | Liu et al. |
| 2002/0121654 A1 | 9/2002 | Yamamoto |
| 2002/0175372 A1 | 11/2002 | Takizawa |
| 2003/0085720 A1* | 5/2003 | Yamazaki et al. ........... 324/752 |
| 2003/0227056 A1* | 12/2003 | Wang et al. ................. 257/347 |
| 2004/0087118 A1 | 5/2004 | Maegawa et al. |
| 2004/0132249 A1 | 7/2004 | Mitsuda et al. |
| 2004/0169023 A1* | 9/2004 | Tanaka ................ 219/121.73 |
| 2006/0091122 A1* | 5/2006 | Sugioka et al. ........ 219/121.69 |
| 2006/0121680 A1 | 6/2006 | Tanaka |
| 2007/0178672 A1 | 8/2007 | Tanaka et al. |

FOREIGN PATENT DOCUMENTS

| | | |
|---|---|---|
| JP | 2001-338894 | 12/2001 |
| JP | 2002-151431 | 5/2002 |
| JP | 2002-246329 | 8/2002 |
| JP | 2002-246601 | 8/2002 |
| JP | 2003-059857 | 2/2003 |
| JP | 2004-158627 | 6/2004 |
| JP | 2004-214607 | 7/2004 |

OTHER PUBLICATIONS

WO 03/099508 Riken et al.*

International Search Report (Application No. PCT/JP2005/021397) dated Feb. 7, 2006.

Written Opinion (Application No. PCT/JP2005/021397) dated Feb. 7, 2006.

* cited by examiner

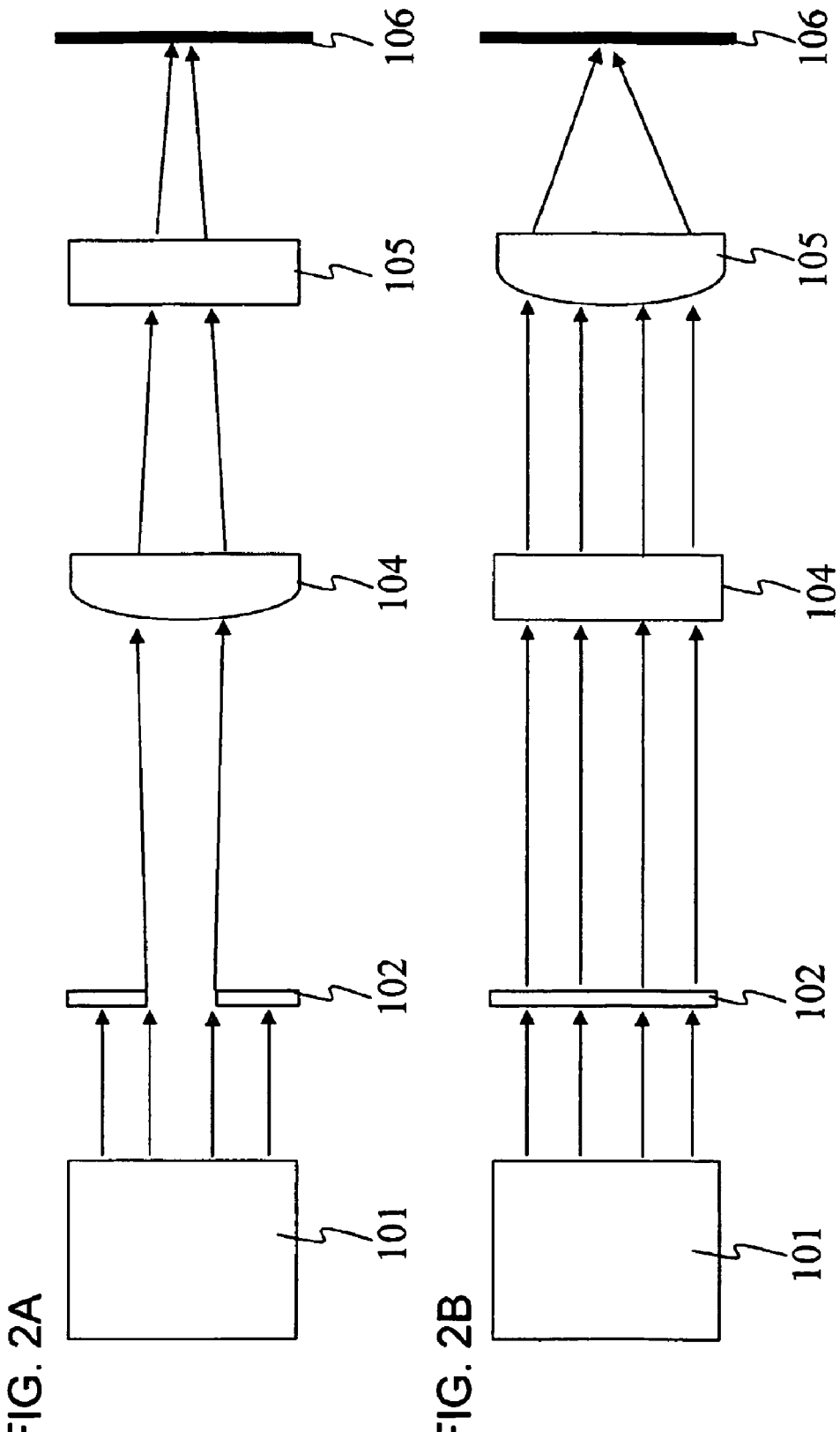

SEMICONDUCTOR DEVICE AND MANUFACTURING METHOD OF THE SAME

TECHNICAL FIELD

The present invention relates to a manufacturing method of a semiconductor device, using a laser irradiation apparatus for irradiating an object with laser light. Specifically, the present invention relates to a semiconductor device having a circuit including a field effect transistor (hereinafter, referred to as an FET). Further, the present invention relates to electronic devices incorporating, as a part thereof, e.g., large scale integrated circuits (LSI), electro-optic devices typified by liquid crystal display panels, light-emitting display devices having an organic light-emitting element, sensor devices such as line sensors, or memory devices such as SRAM or DRAM.

Note that semiconductor devices in this specification mean generic devices which can operate with use of semi-conductive characteristics, and the category includes all types of devices such as electro-optic devices, semiconductor circuits and electronic devices.

In recent years, miniaturization and high-integration of LSI have advanced, for instance, the gate length of a MOS transistor formed over a semiconductor substrate is reduced to a submicron level. When a MOS transistor is simply miniaturized, the effective channel-length is shortened, thereby causing a short channel effect between a source and a drain and reducing a threshold voltage of the MOS transistor. In addition, frequent occurrence of a punchthrough, the increase in leakage current, and the like due to the short-channel effect becomes remarkable.

In order to prevent short channel effects, there is employed an LDD structure or a structure in which the junction depth of a diffusion layer formed in a transistor is shallow. The structure in which the junction depth of a diffusion layer is referred to as an ultra shallow junction. The ultra shallow junction is also referred to as extension.

As well as a doping technique in which impurities are added into a desired region or at a desired depth, an annealing technique for activating added impurities has been considered.

As one of conventional annealing techniques, a RTA (rapid thermal annealing) method in which a whole semiconductor substrate doped with impurities is heated at about 1000° C. with an infrared lamp or the like is known and frequently used. However, the RTA method has a limitation on miniaturization. The RTA method needs a heating time of several seconds, and has a risk that impurities are diffused into a deep portion, since a semiconductor substrate is heated at a high temperature. Thus, the RTA method has a difficulty in responding miniaturization which is expected in the future.

In view of the above problem, a laser annealing method has attracted attentions as a technique for responding miniaturization which is expected in the future. As a conventional technique using a laser, a technique is known in which the surface of a silicon substrate is melted by a 308-nm XeCl excimer laser and then, silicon atoms are recrystallized.

The laser annealing has advantages that the processing time can be shortened to a large degree as compared with another annealing method using radiation heat or conduction heat, and that a semiconductor substrate can be heated selectively, so that the substrate is hardly damaged thermally.

Laser oscillators used for laser annealing are classified broadly into two kinds, which are a pulsed laser oscillator and a continuous wave laser oscillator, in a standpoint of the oscillation method. Laser light (also, referred to as a laser beam) oscillated from a pulsed excimer laser is used for laser annealing in many cases. The excimer laser has advantages that it has a high output power and repetition irradiation is possible at a high repetition rate.

Laser light emitted from an excimer laser has a high absorption efficiency to silicon which is used as a semiconductor in many cases.

For example, laser irradiation is conducted in the manner that laser light is shaped into linear laser light on an irradiation surface by an optical system (such as a beam homogenizer) and an irradiation position of laser light is moved relatively to the irradiation surface. This method is superior industrially because a semiconductor having a large area can be crystallized at one time and thus, high productivity is obtained by this method. Hereinafter, laser light having a linear shape on an irradiation surface is referred to as a linear beam.

DISCLOSURE OF INVENTION

The main purpose of silicon recrystallization with a laser annealing method is to make an impurity region which is damaged by implantation of impurity ions to have a single-crystal state as much as possible, and to electrically activate the impurity region.

A conventional laser annealing method using laser light oscillated from a pulsed excimer laser has some problems to be solved. For example, there is a problem that crystal defects are generated in melting and recrystallizing by laser annealing.

As one of methods for solving the problems, there is a method in which a continuous wave laser oscillator (hereinafter, CW laser) such as an Ar laser or a YVO$_4$ laser or a pulsed laser oscillator having an extremely high repetition rate of 10 MHz or higher (hereinafter, a quasi-CW laser) is employed.

However, in the case of using a CW laser and a quasi-CW laser using a solid state laser medium, the wavelength band of a fundamental wave is from red ray to near-infrared ray, and laser light absorption efficiency in the semiconductor is extremely low. Laser light having high absorption efficiency in the semiconductor is laser light having a wavelength of visible light to ultraviolet light.

Therefore, in the case of using a CW laser or a quasi-CW laser for a laser annealing method, a wavelength is converted to a harmonic of visible light or shorter with a non-linear optical device. For example, the highest conversion efficiency can be obtained in the method of converting a fundamental wave of near-infrared ray which easily provides a high output, to green laser light of the second harmonic.

Harmonics can be obtained by putting a fundamental wave oscillated from a laser medium into a non-linear optical device. However, there is a problem that, when the output of a laser becomes high, a non-linear optical device is damaged by a non linear optical effect such as multiphoton absorption, and thus, is broke down. Therefore, a CW laser of visible range which is produced at present has an output power of at most about 15 W due to such a problem of a non-linear optical device.

Further, in conducting laser annealing using a CW laser or a quasi-CW laser, productivity is low as compared with an excimer laser and thus, it is necessary to further enhance the productivity. For example, CW laser light of 532 nm with 10 W is formed into a linear beam of about 300 μm in a major axis direction and about 10 μm in a minor axis direction to conduct laser annealing. At this time, the width of a region which can be annealed by scanning once is about 200 μm. Accordingly, scanning of a beam spot is required to be conducted an infinite number of times in order to irradiate the whole surface of a semiconductor wafer having a diameter of 100 to 300 mm which is used in a mass production process. Note that, in this specification, the major axis refers to the long side of a laser beam, and the minor axis refers to the short side of the laser beam, regardless of the shape of the laser beam on an irradiation surface, such as a linear shape, an elliptical shape or a rectangular shape.

According to the present invention, a fundamental wave is used without putting laser light into a non-linear optical device, and laser annealing is conducted by irradiating a semiconductor wafer with pulsed laser light having high intensity and a high repetition rate.

High intensity means a high peak output power per unit of time and per area, and the peak output power of laser light in the present invention ranges from 1 GW/cm$^2$ to 1 TW/cm$^2$.

A fundamental wave with a wavelength of about 1 μm is not absorbed so much by a semiconductor wafer in irradiating the semiconductor wafer with the fundamental wave. Thus, the fundamental wave has a low absorption efficiency. The present inventors have found that a fundamental wave emitted from a pulsed laser having a pulse width on the order of picoseconds, or on the order of femtoseconds (10$^{-15}$ seconds) can provide high intensity laser light. Thus, a non linear optical effect (multiphoton absorption) is generated and the fundamental wave can be absorbed by the semiconductor wafer.

In general, when an energy of one photon is smaller than an energy gap of a semiconductor, the photon is not absorbed by the semiconductor. Thus, in a conventional manner, energy of one photon is increased by converting a fundamental wave to a harmonic with a non-linear optical device as described above. In the case of using an n-th (n is a natural number) harmonic with a wavelength λ, the energy E of one photon is represented by the next equation using Planck's constant h and light velocity c.

$$E = \frac{hc}{\lambda/n} \quad \text{[Equation 1]}$$

When laser light with high intensity is used, high electromagnetic field is generated in a material irradiated with laser light, thereby generating a nonlinear optical effect (multiphoton absorption). By the multiphoton absorption, photons can be absorbed at the same time in multiple steps without letting light passing through the semiconductor, in the case where the energy of one photon smaller than the energy band gap of the semiconductor.

According to the present invention, a laser oscillator having a higher output power than 15 W, e.g., 40 W output power can be used for laser annealing, since a non-linear optical device is not used and thus light is not converted to a harmonic. Therefore, the width of an impurity region activated by one time laser-scanning can be increased, and thus the productivity can be enhanced dramatically.

A structure of the present invention disclosed in this specification is a manufacturing method of a semiconductor device, which comprises the steps of: selectively injecting impurities into a semiconductor substrate to form an impurity region; processing a laser beam having a fundamental wave into a long beam on a surface of the impurity region; and moving the surface of the impurity region relatively to the long beam to scan the laser beam to activate the impurity region.

In the above structure, the semiconductor substrate is a single-crystal silicon substrate or a compound semiconductor substrate, typically, an n-type or p-type single-crystal silicon substrate, a GaAs substrate, an InP substrate, a GaN substrate, a SiC substrate, a sapphire substrate, or a ZnSe substrate. As a semiconductor element including an integrated circuit formed using a semiconductor substrate, typically, a power supply circuit, a reception-transmission circuit, a memory and an amplifier of an audio processing circuit are given.

Further, an SOI substrate may be used. Another structure of the present invention is a manufacturing method of a semiconductor device, which comprises the steps of: forming a gate insulating film over a semiconductor layer of an SOI substrate; forming a gate electrode over the gate insulating film; selectively injecting impurities into the semiconductor layer of the SOI substrate to form an impurity region; processing a laser beam having a fundamental wave into a long beam on a surface of the impurity region; and moving the surface of the impurity region relatively to the long beam to scan the laser beam to activate the impurity region.

In each of the above structures, the impurity regions are source and drain regions of a field effect transistor. An impurity element imparting an n-type conductivity to a semiconductor (such as As or P) or an impurity element imparting a p-type conductivity to a semiconductor (such as B) is added into the source and drain regions to reduce resistance. By selective laser irradiation, a desired region is only activated to reduce resistance.

In the above structure, the impurity region is an extension region of a field effect transistor. The junction depth of the extension region is shallower than the junction depth of the source and drain regions. An impurity element imparting an n-type conductivity to a semiconductor or an impurity element imparting a p-type conductivity to a semiconductor is included in the extension region. In addition, both an impurity element imparting an n-type conductivity to a semiconductor and an impurity element imparting a p-type conductivity to a semiconductor may be included.

In the above structure, the laser beam is oscillated with a pulse width of 1 femtosecond or more and 10 picoseconds or less. The pulse width of 1 femtosecond or more and 10 picoseconds or less is employed to obtain a sufficiently high intensity for generating multiphoton absorption. A laser beam with a pulse width of several ten picoseconds longer than ten picoseconds does not generate multiphoton absorption. In addition, when an experimental test for heating a semiconductor by a laser beam with a pulse width of 150 femtoseconds was conducted, it could be observed that the semiconductor was heated. Therefore, it is thought that multiphoton absorption is generated.

As a laser that can provide high enough intensity to cause multiphoton absorption, there is a pulsed laser with a pulse width of pico second or femto second. As the pulsed laser, lasers in which Nd, Yb, Cr, Ti, Ho, Er, or the like is added as a dopant into a crystal of Sapphire, YAQ ceramics YAQ ceramics Y$_2$O$_3$, KGW, KYW, Mg$_2$SiO$_4$, YLF, YVO$_4$, GdVO$_4$ or the like are given.

Also, one feature of the present invention is that the repetition rate of a laser used in the present invention is 10 MHz or more. This repetition rate is extremely higher than that of the conventional pulsed laser, which is from several tens to several hundreds Hz. It is said that it takes several tens to several hundreds nanoseconds to solidify the semiconductor completely after the semiconductor is irradiated with the pulsed laser light. When the pulsed laser light has a repetition rate of 10 MHz or more, it is possible to irradiate the semiconductor with pulsed laser light before the semiconductor is solidified after it has been melted by the previous laser light.

By irradiating the same portion with laser light again within several tens to several hundreds nanoseconds, a melting state can be maintained. Therefore, when a pulsed laser having a repetition rate of 10 MHz or more is adopted, it can be considered as a CW laser in a quasi manner and thus, such a laser is referred to as a quasi-CW laser.

Note that the category of a laser annealing method in this specification includes a technique by which a damaged layer or an amorphous layer formed in a semiconductor substrate or a semiconductor film is recrystallized, a technique by which an amorphous semiconductor film formed over a substrate is crystallized, and a technique for activating a dopant added into a semiconductor layer. In addition, the laser annealing method includes a technique for planarization or surface modification of a semiconductor substrate or a semiconductor film.

In addition, multiphoton absorption in this specification means simultaneous absorption of two or more photons, and that reactive electronic excitation state, which cannot be reached by absorption energy of only one photon having the same energy as each of the two or more photons, can be reached by the absorption energy of two or more photons. It should be noted that the term "simultaneous" means that two phenomena occur within $10^{-14}$ seconds. In addition, the described above electronic excitation state is an electronic state of molecules at higher energy than an electronic ground state of molecules, which is achieved by absorbing electromagnetic radiated emission and in which a life time is longer than $10^{-13}$ seconds.

A device obtained by the above manufacturing method is also one of the present invention. A structure of the device is a semiconductor device having an integrated circuit including a field effect transistor, which comprises a gate insulating film formed over a semiconductor layer; a gate electrode provided over the gate insulating film; a channel forming region formed in the semiconductor layer under the gate electrode through the gate insulating film; an extension region into which an n-type or p-type impurity element is added, and which is located on opposite sides of the channel forming region; and a source region and a drain region which are in contact with the extension region, wherein the extension region has a junction depth shallower than the source region and the drain region; and wherein a length of the channel forming region is 5 nm or more and 80 nm or less.

According to the present invention, selective laser irradiation can be carried out much precisely to conduct activation. Therefore, the length of a channel forming region of a field effect transistor can be set arbitrarily in the range of 5 nm to 80 nm.

In the above structure, the length of the channel forming region is equal to the width of the gate electrode. A channel forming region which is overlapped with the gate electrode is not irradiated with laser light, and diffusion does not occur there. Thus, the length of the channel forming region is equal to the width of the gate electrode.

In the above structure, the integrated circuit includes at least one of a controller, a CPU, and a memory.

By the present invention, a non-linear optical device for converting a wavelength is not needed, and a laser beam with an extremely high output power, for example, a laser beam having an energy of twice or more times as high as a harmonic can be obtained. Further, by the present invention, it is possible to prevent activated impurities from unnecessarily diffusing into a deep portion in a substrate. Therefore, impurities in an irradiated region can be activated efficiently in a state in which a semiconductor substrate is kept at a sufficient low temperature in recrystallization, and the element thus obtained is suitable for developing a higher performance device.

According to the present invention, an ultra shallow junction having a shallow junction depth can be formed. By forming an ultra shallow junction, leak current can be reduced, and low power consumption can be achieved. Further, miniaturization and high integration of a semiconductor integrated circuit become possible.

Further, a non-linear optical device has a defect that a maintenance-free state, which is an advantage of a solid state laser, cannot be kept long, since the non-linear optical device is easily changed in its quality. However, the present invention can overcome the defect, since the present invention does not need a non-linear optical device. In other words, stability and reliability of a laser irradiation apparatus itself can be enhanced, according to the present invention.

BRIEF DESCRIPTION OF DRAWINGS

In the accompanying drawings:

FIGS. 2A and 2B show an optical system of a laser irradiation apparatus;

BEST MODE FOR CARRYING OUT THE INVENTION

Embodiment Modes of the present invention are described below. The present invention can be carried out in many different modes, and modes and details herein disclosed can be modified in various ways without departing from the spirit and the scope of the present invention.

Embodiment Mode 1

Figure 1:
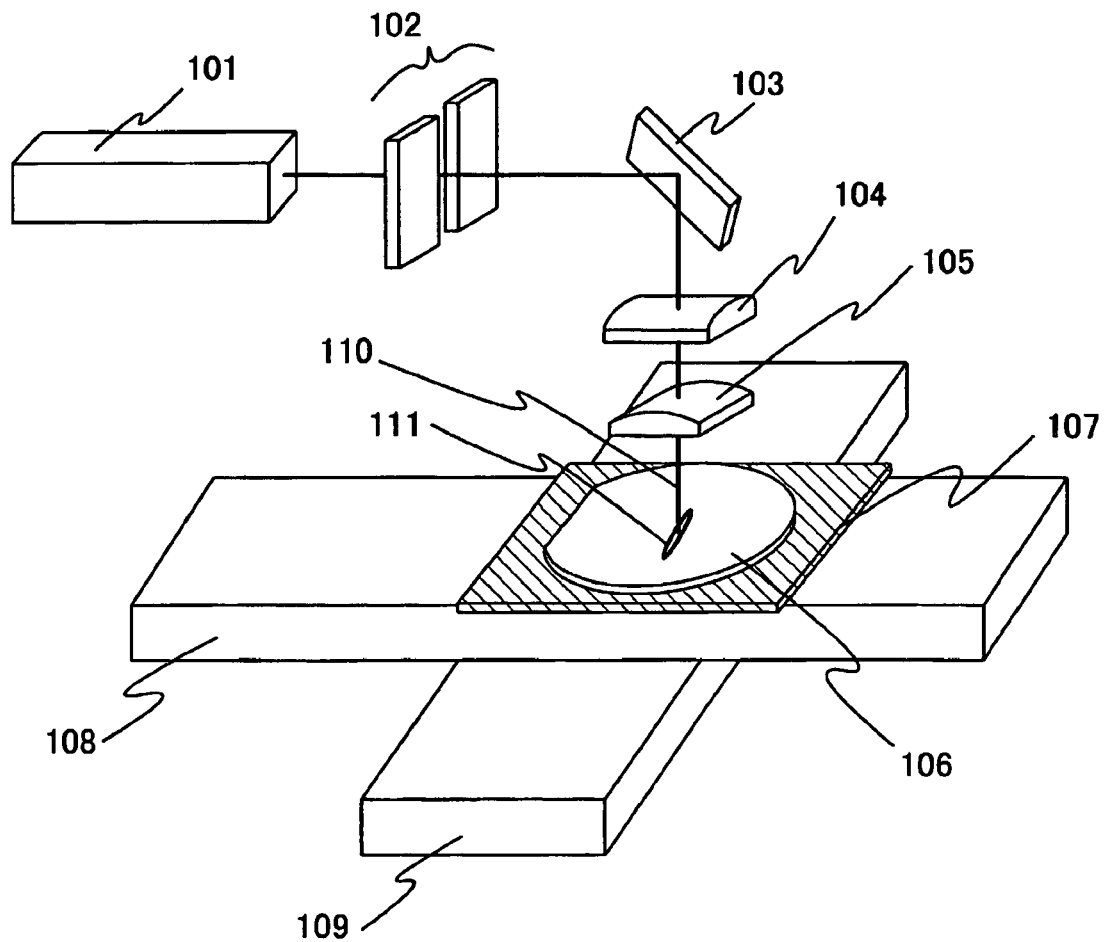
FIG. 1 is a perspective view showing one example of a laser irradiation apparatus.

FIG. 1 is a perspective view showing one example of a laser irradiation apparatus according to the present invention.

As a laser oscillator 101 shown in FIG. 1, a laser oscillator which oscillates with a pulse width on the order of femtoseconds ($10^{-15}$ second) is used (also referred to as a femtosecond laser). As the laser oscillator, lasers in which Nd, Yb, Cr, Ti, Ho, Er, or the like is added as a dopant into a crystal of Sapphire, YAG, ceramics YAG, ceramics $Y_2O_3$, KGW, KYW, $Mg_2SiO_4$, YLF, $YVO_4$, $GdVO_4$ or the like can be given. Note that a non-linear optical device is not included in the laser oscillator 101 and thus the fundamental wave of a laser beam is emitted. A non-linear optical device for converting light oscillated from a laser medium to a harmonic is not included in the laser oscillator 101; however, the laser oscillator 101 has high enough light intensity to generate a non linear optical effect (multiphoton absorption) in a semiconductor.

First, a laser beam emitted from the laser oscillator 101 passes through a slit 102. By the slit 102, a weak portion in energy of a laser beam can be blocked and the length of the major axis of the laser beam on an irradiation surface can be controlled. The slit 102 used in the present invention is not especially limited, and a slit having a structure or a shape that can block a weak portion of intensity when light passes through a slit, can be used.

Thereafter, the direction of a laser beam that has passed through the slit 102 is changed by a mirror 103 and is deflected toward a semiconductor substrate 106. It should be noted that the direction of the laser beam that has been changed may be perpendicular or diagonal to the substrate.

Then, the laser beam whose direction has been changed by the mirror 103 projects an image of the slit 102 onto the semiconductor substrate 106 which is an irradiation surface, by a first cylindrical lens 104 that operates only in one direction. Further, the laser beam is condensed by a second cylindrical lens 105 that operates only in one direction, which is rotated by 90° from the first cylindrical lens 104. Then, the laser beam is delivered to the semiconductor substrate 106. A beam irradiation region 111 having a linear, elliptical or rectangular shape on the irradiation surface is obtained by the first cylindrical lens 104 and the second cylindrical lens 105. The first cylindrical lens 104 shapes a laser beam in a major axis direction of the beam irradiation region 111, while the second cylindrical lens 105 shapes the laser beam in a minor axis direction of the beam irradiation region 111. The cylindrical lens used in the present invention may be planoconvex, in which either the side the beam is incident into or emitted from is convex, or biconvex. In the case of using a planoconvex cylindrical lens, it is preferable that the cylindrical lens has a convex surface on the side which the laser beam is incident into, for the sake of low aberration and high accuracy.

An optical system of the present invention is described in detail with reference to FIGS. 2A and 2B. The reference numerals used in FIGS. 2A and 2B are the same as those in FIG 1. FIG. 2A shows a laser beam in the major axis direction of a laser irradiation region and FIG. 2B shows a laser beam in the minor axis direction of the laser irradiation region. A laser beam emitted from the laser oscillator 101 is blocked partially by the slit 102 and only a portion of the laser beam having high intensity passes through the slit. The laser beam which has passed through the slit 102 projects an image formed by the slit 102 onto the semiconductor substrate 106, by the first cylindrical lens 104. The laser beam 110 shown by the solid line in FIG. 1 shows a laser beam which passes through a center of the beam irradiation region 111.

The positional relationship between the first cylindrical lens 104, the slit 102, and the semiconductor substrate 106 as an irradiation surface, which is one feature of the present invention, are described in detail. The reason for using slit 102 is to prevent a portion of the laser beam having weak energy from being delivered onto the semiconductor substrate. If such a laser beam having the portion with weak energy is delivered onto the semiconductor substrate, a polycrystal region having relatively small crystal grains and having an uneven surface (here, referred to as a poorly crystalline region) is formed, which is not preferable. In view of this problem, the slit 102 is used so as not to form such a region in the semiconductor substrate. In general, when a laser beam is partially blocked by a slit, a phenomenon called diffraction due to coherence of laser light is caused, and thus diffraction fringes are generated in the laser beam. A method for preventing diffraction fringes on the irradiation surface is described below.

In the two equations shown below, *f* is the focal length of the first cylindrical lens 104, s is the width of the opening of the slit 102, M1 is the distance between the slit 102 and the cylindrical lens 104, M1 is the distance between the first cylindrical lens 104 and the semiconductor substrate 106, and L is the length of the linear beam in the major axis direction on the semiconductor substrate 106 which is the irradiation surface. The positional relationships are given by the following two equations:

$$\frac{s}{L} = \frac{M1}{Ml} \quad \text{[Equation 2]}$$

$$\frac{1}{f} = \frac{1}{M1} + \frac{1}{Ml} \quad \text{[Equation 3]}$$

Based on the equations shown above, two other equations can be given:

$$M1 = \frac{f(s+L)}{L} \quad \text{[Equation 4]}$$

$$M2 = \frac{f(s+L)}{s} \quad \text{[Equation 5]}$$

By arranging the slit, the first cylindrical lens, and the irradiation surface, in accordance with the above equations, the fringes due to diffraction are not translated to the semiconductor substrate. Accordingly, a laser irradiation which rarely forms a poorly crystalline region can be realized.

In the case that the diameter, the output power or the shape of an emitted laser beam can be used as they are, two cylindrical lenses are not necessarily used. In addition, in the case that the ratio between the major axis and the minor axis of an emitted laser beam is kept during condensing light, a spherical lens may be used instead of a cylindrical lens.

The semiconductor substrate 106 is moved at an appropriate speed to irradiate the whole surface of the substrate with the laser light. In irradiating the substrate with the laser light, the semiconductor substrate 106 is fixed on a substrate fixing stage 107 by a suction means or a mechanical-fixing means so as not to drop. In addition, the substrate fixing stage 107 can be moved using an X stage 108 and a Y stage 109, in an X or Y direction in the surface of the substrate fixing stage, which is parallel to the surface of the semiconductor substrate. By the X stage 108 and the Y stage 109, the semiconductor substrate fixed on the substrate fixing stage 107 can be moved at a speed of 100 to 1000 mm/sec. Here, the stage which the semiconductor substrate is set on is moved in an X direction (or a Y direction) with respect to the fixed irradiation region of a laser beam so as to scan laser light. It should be noted that the optimum scanning speed that is anticipated based on the experience of the present inventors is around 400 mm/sec.

The scanning method is not limited to the method in which X stage 108 and Y stage 109 are moved, and laser light may be scanned by a galvanometer mirror or a polygon mirror. A laser beam that is formed into a belt-like shape is delivered along the lengthwise direction (Y direction) of the substrate and the irradiation region is moved relatively to the substrate so as to scan laser light in the crosswise direction (X direction).

By forming a semiconductor element such as an FET appropriately and by using laser irradiation of the present invention as an activation treatment, such an FET can be applied in the development of a higher performance device.

The diffusion distance of impurities with respect to the pulse width of a laser can be obtained by the following equation.

$$L_D \approx (D_F \tau_L)^{1/2} \quad \text{[Equation 6]}$$

In the equation 6, $\tau_L$ represents time, i.e., a pulse width of a laser. In addition, $D_F$ represents a thermal diffusion coefficient of a material, and $D_F = K_T/PC_p$, wherein $K_T$ represents thermal conductivity, p represents density and Cp represents specific heat capacity. The thermal conductivity $K_T$ of crystalline silicon is 148 W/m-k, and the density p of crystalline silicon is 2330 kg/cm³, the specific heat capacity Cp of crystalline silicon is 700 J/(kg-k). Accordingly, the thermal diffusion coefficient $D_F$ of crystalline silicon is $9.074 \times 10^{-5}$ m²/s.

For example, when the pulse width is set at 1 ps, the distance of the thermal diffusion of crystalline silicon is calculated as 9.525853 nm. In the case where a laser beam emitted from a pulse laser having a pulse width on the order of picoseconds, or on the order of femtoseconds ($10^{-15}$ seconds), the distance of the thermal diffusion of crystalline silicon is extremely small, and only a portion irradiated with the laser beam becomes a state of high temperature and high density energy. Thus, almost no thermally affected layer due to thermal diffusion is generated. In other words, in the case where a laser beam emitted from a pulse laser having a pulse width on the order of picoseconds, or on the order of femtoseconds ($10^{-15}$ seconds) is used to activate impurities added into the semiconductor, an ultra shallow junction having a shallow junction depth can be formed.

In the present invention, a junction depth can be freely set by appropriately setting an irradiation condition such as a pulse width of a laser.

Here, an example of laser annealing applied for activation has been described. However, the present invention is not especially limited, and can be applied to various kinds of laser annealing processes typified by such a process as a suicide formation process.

Embodiment Mode 2

Figure 3A:
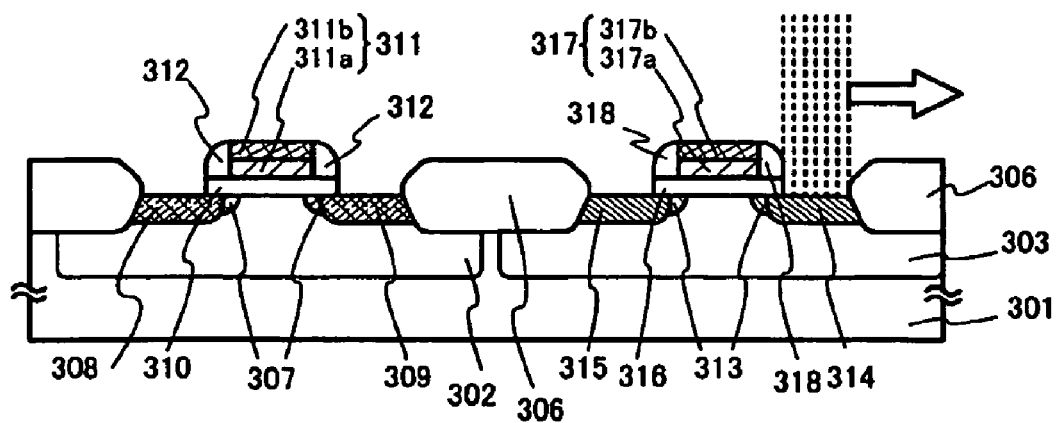
FIGS. 3A and 3B are cross-sectional views of manufacturing steps of an FET according to one aspect of the present invention.
Figure 3B:
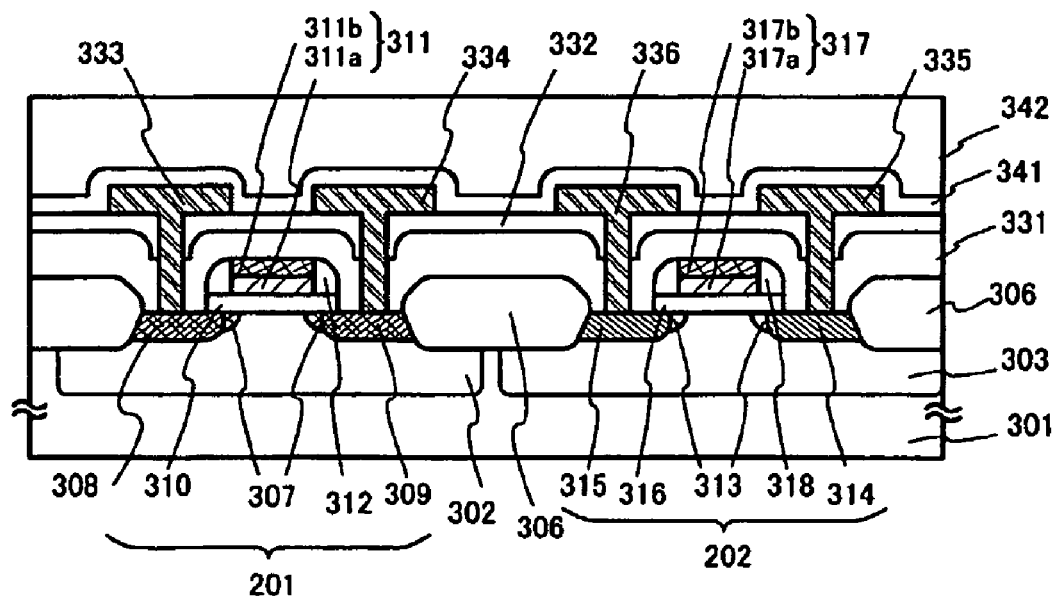

A procedure for manufacturing an FET using the present invention will be hereinafter described briefly with reference to FIGS. 3A and 3B. Here, an example of activation is shown, in which a non linear optical effect (multiphoton absorption) is produced in an irradiation region by irradiating an impurity region doped with impurities by laser light having a fundamental wave with a wavelength of a near-infrared region, and a pulse width of about 10 ps or less.

A silicon substrate 301 formed of single-crystal silicon is prepared. An n-well 302 is selectively formed in a first element formation region over a main surface (an element formation region or a circuit formation region) of the silicon substrate, and a p-well 303 is selectively formed in a second element formation region over the same surface.

Next, a field oxide film 306 to be an element isolation region for partitioning the first element formation region and the second element formation region is formed. The field oxide film 306 is a thick thermal oxide film and may be formed by a known LOCOS method. Note that the method for partitioning the element formation regions is not limited to the LOCOS. For example, the element isolation region may have a trench structure by using a trench isolation method, or the LOCOS structure and the trench structure may be combined.

Subsequently, a gate insulating film is formed by, for example, thermally oxidizing the surface of the silicon substrate. The gate insulating film may also be formed by CVD. A silicon oxynitride film, a silicon oxide film, a silicon nitride film, or a stack thereof may be used. For example, a stack film of a silicon oxide film with a thickness of 5 nm which is obtained by thermal oxidation and a silicon oxynitride film with a thickness of 10 to 15 nm which is obtained by CVD, is formed.

A stack film of polysilicon layers 311a and 317a and suicide layers 311b and 317b are formed over the entire surface, and the stack film is patterned by lithography and dry etching so as to form gate electrodes 311 and 317 having a polycide structure over the gate insulating film. The polysilicon layers 311a and 317a may be doped with phosphorus (P) at a concentration of about $10^{21}$/cm³ in order to reduce the resistance. Alternatively, high concentration n-type impurities may be diffused after forming the polysilicon layers 311a and 317a. Further, the suicide layers 311b and 317b can be formed of a material such as molybdenum suicide (MoSix), tungsten suicide (WSix), tantalum silicide (TaSix), or titanium suicide (TiSix) using a known method.

Subsequently, ion implantation is conducted on the silicon semiconductor substrate through the gate insulating film to form an extension region. In this embodiment mode, an impurity region formed between each channel forming region and each source and drain region is referred to as an extension region. The impurity concentration in the extension regions 307 and 313 may be lower or higher than, or the same as the impurity concentration in the source region and the drain region. Accordingly, the impurity region of the extension region may be determined depending on the characteristics required for a semiconductor device.

Since this embodiment mode describes a case of manufacturing a CMOS, the first element formation region for forming a p-channel FET is coated with a resist material, and arsenic (As) or phosphorus (P) which is an n-type impurity is injected into the silicon substrate. Further, the second element formation region for forming an n-channel FET is coated with a resist material, and boron (B) which is a p-type impurity is injected into the silicon substrate.

Subsequently, a first activation treatment is conducted in order to activate the implanted impurities and to repair crystal defects in the silicon substrate, which is generated by ion-implantation. In this embodiment mode, as shown in Embodiment Mode 1, irradiation of laser light having a fundamental wave and a pulse width of 10 ps or less is conducted to generate a non linear optical effect (multiphoton absorption) to carry out an activation. In order to efficiently conduct this process, the repetition rate of the laser may be 10 MHz or more. The semiconductor substrate is heated up to a temperature around the melting point of Si, and a thin layer on the surface is locally heated to be activated. At this time, since impurities inside Si are heated in an extremely short time, the distance in which the impurities can move is extremely short. However, since the distance is sufficient for the impurities to move to the lattice point of Si, the implanted impurities can be activated sufficiently by this process. In addition, as mentioned above, since the distance in which the impurities can move is extremely short, i.e., about 1 nm or less, diffusion of impurities can be suppressed to the utmost extent.

Thereafter, sidewalls 312 and 318 are formed on the sides of gate electrodes. For example, an insulating material layer formed of silicon oxide may be deposited over the entire surface by CVD, and the insulating material layer may be etched back to form the sidewalls. In the etch back, the gate insulating film may be selectively removed in a self-alignment manner. Alternatively, the gate insulating film may be etched after the etch back. Thus, the gate insulating films 310 and 316 having the total width of the gate electrodes and the sidewalls provided on the opposite sides of the gate electrodes are formed.

Next, ion implantation is conducted to the exposed silicon substrate to form a source region and a drain region. Since this is a case of manufacturing a CMOS, the first element formation region for forming a p-channel FET is coated with a resist material, and arsenic (As) or phosphorus (P) which is an n-type impurity is injected into the silicon substrate to form a source region 314 and a drain region 315. Further, the second element formation region for forming an n-channel FET is coated with a resist material, and boron (B) which is an p-type impurity is injected into the silicon substrate to form a source region 308 and a drain region 309.

A second activation treatment is thereafter conducted in order to activate the implanted impurities and to repair crystal defects in the silicon substrate, which is generated by ion-implantation. The second activation treatment is conducted by irradiation of laser light having a fundamental wave and a pulse width of 10 ps or less, and a non linear optical effect (multiphoton absorption) is generated. At this time, the state shown in FIG. 3A is obtained.

After the activation, an interlayer insulating film, a plug electrode, a metal wiring, and the like are formed. The first interlayer insulating film 331 is formed to have a thickness of 100 to 2000 nm with a silicon oxide film, a silicon oxynitride film, or the like by plasma CVD or low pressure CVD. Further, a second interlayer insulating film 332 formed of phosphosilicate glass (PSG), borosilicate glass (BSG), or pborophosphosilicate glass (BPSG) is formed thereover. The second interlayer insulating film 332 is manufactured by spin coating or normal pressure CVD to increase planarity.

Source electrodes 333 and 335, and drain electrodes 334 and 336 are formed after forming contact holes reaching the source regions and the drain regions of the respective FETs in the first interlayer insulating film 331 and the second interlayer insulating film 332, and aluminum (Al) which is commonly used as a low resistance material may preferably used. Further, the electrodes may have a stacked structure of aluminum (Al) and titanium (Ti).

Although not shown here, a contact hole reaching a gate electrode is provided in the first interlayer insulating film 331 and the second interlayer insulating film 332, and an electrode electrically connecting to a wiring provided over the second interlayer insulating film is formed over the part of the first interlayer insulating film exposed in the opening.

Lastly, a passivation film 341 and a third interlayer insulating film 342 are formed. At this time, the state shown in FIG. 3B is obtained. In FIG. 3B, a transistor shown on the left side is a p-channel FET 201 and a transistor shown on the right side is an n-channel FET 202.

Further, the passivation film 341 is formed of a silicon nitride film, a silicon oxide film, or a silicon nitride oxide film by plasma CVD. The third interlayer insulating film 342 is formed using an organic resin material to have a thickness 1 to 2 μm. As the organic resin material, polyimide, polyamide, acrylic, benzocyclobutene (BCB), or the like can be used. It is advantageous to use an organic resin film since a method for forming an organic resin film is simple, the parasitic capacitance can be reduced because of low dielectric constant, it is suitable for planarization, and the like. Naturally, an organic resin film other than the one mentioned above may also be used.

According to the present invention, short-channel effects such as a punchthrough and a gate leakage current can be suppressed. Thus, miniaturization of a semiconductor device can be promoted. Further, by the present invention, the distance between a source region and a drain region of an FET, and the width of an extension region can be designed freely. Therefore, by the present invention, the channel length of an FET can be set freely within the range of 5 to 80 nm.

This embodiment mode can be freely combined with Embodiment Mode 1.

Embodiment Mode 3

A manufacturing method of a semiconductor device of the present invention is described with reference to FIGS. 4A to 7. Embodiment Mode 3 describes an example of employing an SOI (silicon on insulator) substrate in which an insulating layer and a single-crystal semiconductor layer are stacked.

Figure 4A:
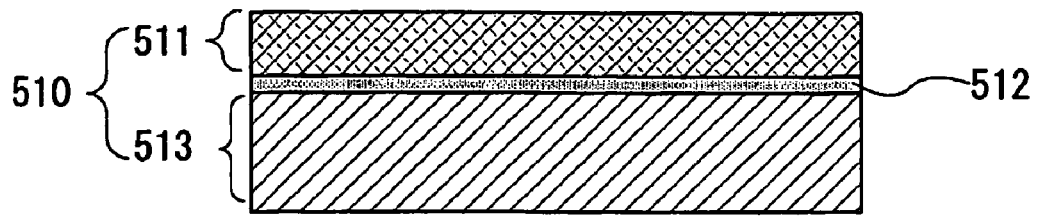
FIGS. 4A to 4D each show manufacturing steps of a SIMOX substrate.

As SOI substrates, for example, a SIMOX (separation by implanted oxygen) substrate can be given. A SIMOX substrate 510 is a substrate which is manufactured by embedding oxygen molecules into a portion slightly deeper than the surface of the single-crystal semiconductor layer, and oxidizing it at a high temperature, thereby forming an insulating layer and a single-crystal semiconductor layer on the insulating layer. The substrate is a stack of a first single-crystal semiconductor layer 511, an insulating layer 512, and a second single-crystal semiconductor layer 513 (FIG. 4A).

Figure 4B:
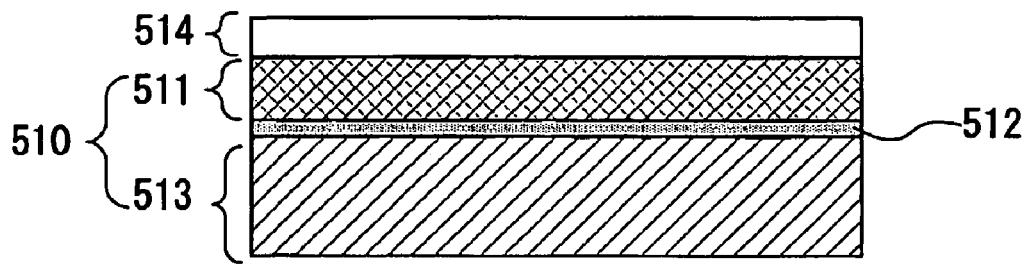
Figure 4C:
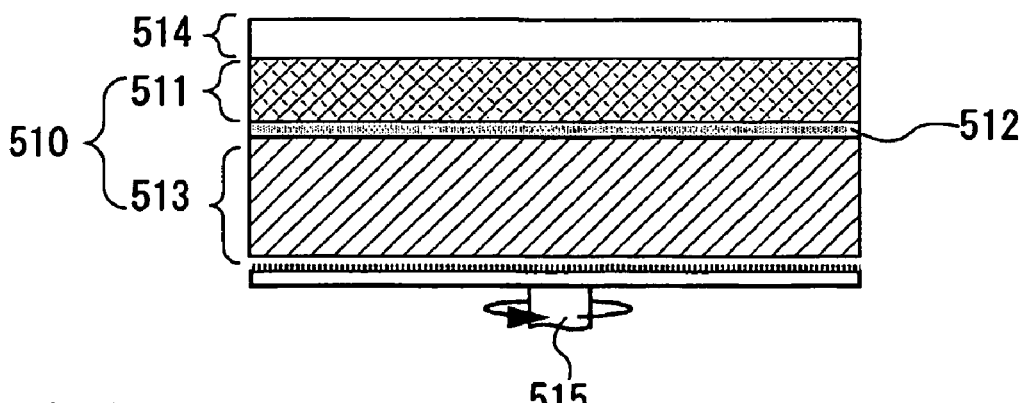
Figure 4D:
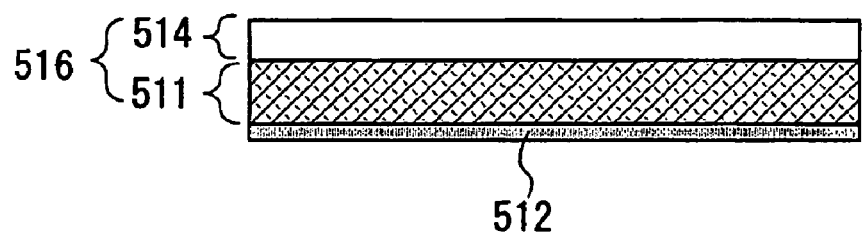

A manufacturing method of a semiconductor device of the present invention using a SIMOX substrate 510 is described. A plurality of first elements such as a field effect transistor using, as an active layer, a first single-crystal semiconductor layer 511 which is one surface of the SIMOX substrate 510, are formed. Then, a layer 514 including a second element is formed over the first single-crystal semiconductor layer 511 (FIG. 4B). The second single-crystal semiconductor layer 513, which is an opposite surface to the one surface of the SIMOX substrate 510, is removed by etching (FIG. 4C). Then, a semiconductor device 516 in which the insulating layer 512, the first single-crystal semiconductor layer 511 and the layer 514 including second elements are sequentially stacked, is completed (FIG. 4D).

It is to be noted that the second single-crystal semiconductor layer 513 may be removed by using a grinding and polishing apparatus 515 such as a grind stone, by using an etching agent, or by using both the grinding and polishing apparatus 515 and an etching agent in combination. It is preferable that the second single-crystal semiconductor layer 513 be ground and polished until the second single-crystal semiconductor layer 513 is thinned to a certain degree and then removed by an etching agent until the insulating layer 512 is exposed. If wet etching is employed, the etching agent may be, for example, a mixed solution in which fluorinated acid is diluted with water or ammonium fluoride; a mixed solution of fluorinated acid and nitric acid; a mixed solution of fluorinated acid, nitric acid, and acetic acid; a mixed solution of hydrogen peroxide and sulfuric acid; a mixed solution of hydrogen peroxide, ammonia water and water; or a mixed solution of hydrogen peroxide, hydrochloric acid and water. If dry etching is employed, the etching agent may be, for example, a gas containing a halogen atom or molecule such as fluorine, or a gas containing oxygen. It is preferable to use a gas or a liquid containing halogen fluoride or an interhalogen compound. For example, chlorine trifluoride ($ClF_3$) is preferably used as the gas including halogen fluoride.

The thickness of the second single-crystal semiconductor layer 513 included in the SIMOX substrate 510 ranges from several tens to several hundred μm while that of the first single-crystal semiconductor layer 511 is as small as 0.3 μm or less. Therefore, when the second single-crystal semiconductor layer 513 is removed after forming a plurality of field-effect transistors using the first single-crystal semiconductor layer 511, a small, thin, and lightweight semiconductor device, e.g., an ultra large scale integrated circuit (ULSI), memory devices such as SRAMs, DRAMs, can be provided.

For further explanation, a manufacturing method for forming a field effect transistor as the first element, and a DRAM, which is a memory element, as the second element, is described with reference to FIGS. 5A to 5F and 6.

Figure 5A:
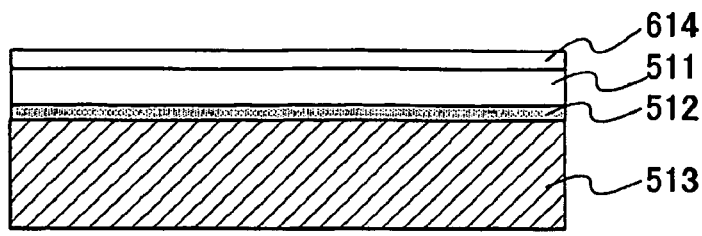
FIGS. 5A to 5F each show manufacturing steps of an FET using SIMOX substrate.

As shown in FIG. 5A, an inorganic insulating film 614 is formed over the SIMOX substrate in which the first single-crystal semiconductor layer 511, the insulating layer 512 and the second single-crystal semiconductor layer 513 are stacked.

Figure 5B:
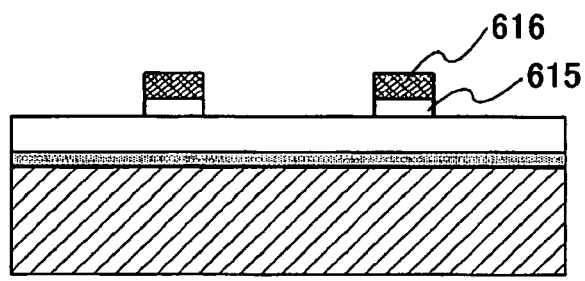

Thereafter, a gate electrode 616 made of a conductive material is formed, and an inorganic insulating film is etched in a self-alignment manner using the gate electrode 616 as a mask to form a gate insulating film 615. At this time, the state shown in FIG. 5B is obtained.

Figure 5C:
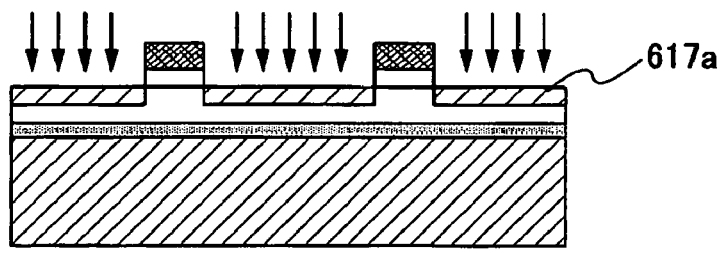

Then, impurities are introduced by a plasma doping method to form a first impurity region 617a, so as to form an extension region. By the plasma doping method, the impurities can be introduced at an extremely shallow level. At this time, the state shown in FIG. 5C is obtained.

Figure 5D:
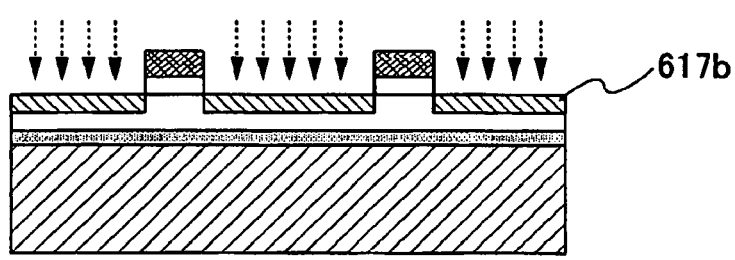

Thereafter, irradiation of laser light having a fundamental wave and a pulse width of 10 ps or less is carried out to activate the introduced impurities at the extremely shallow level and a high concentration profile (distribution). By the laser irradiation, laser annealing for generating a non linear optical effect (multiphoton absorption) in the irradiated region is conducted. In this way, a first impurity region 617b which is electrically activated is formed. At this time, the state shown in FIG. 5D is obtained.

Figure 5E:
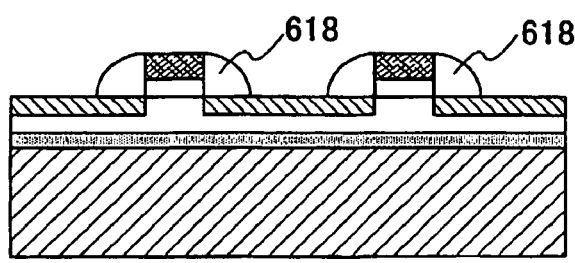

A silicon nitride film is formed to cover the gate electrode 616, and is anisotropically dry-etched in the film thickness. In this way, as shown in FIG. 5E, the silicon nitride film remaining partially on the side portions of the gate electrode 616 becomes a sidewall 618. The reliability of the field effect transistor is enhanced, because the concentration gradient of the impurities is formed at the end portions of the gate electrode 616 by forming the sidewall 618.

Figure 5F:
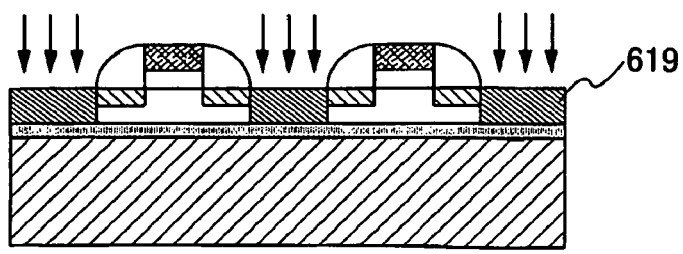

Then, impurities are introduced by an ion doping method to form a second impurity region 619, to form source and drain regions. By the ion doping method, the impurities are injected more deeply than the first impurity region. At this time, the state shown in FIG. 5F is obtained.

Subsequently, the second impurity region 619 is activated. For this activation, laser annealing is conducted with an energy density of about 0.1 to 1 J/cm$^2$ using a YAG laser or a XeCl laser. Instead of this laser annealing, laser annealing using laser light having a fundamental wave and a pulse width of 10 ps or less can also be conducted.

After a first silicon oxide film 620 is formed by a CVD method, it is planarized by CMP and a contact hole is formed by a photolithography process. The contact hole formed by etching the first silicon oxide film 620 is filled with polysilicon, and a leading terminal (also referred to as a plug) 621 to be in contact with the second impurity region 619 is formed. Plugs 624 and 625 for capacitors are formed at the same time. Then, after a second silicon oxide film 622 is formed over the entire surface, a portion for forming a bit line, is opened. A TiN film and a W film are stacked by a sputtering method and patterned to form a bit line 623. The bit line 623 is shared by two memory cells.

In order to form a capacitor over the bit line 623, after a third silicon oxide film 626 and a silicon nitride film 627 are formed by a CVD method, they are planarized by CMP, and a contact hole is formed by a photolithography process. The contact hole formed by etching the third silicon oxide film 626 and the silicon nitride film 627 is filled with polysilicon, and second plugs 628 and 629 for the capacitors, which are to be in contact with the first plugs 624 and 625, are formed.

Thereafter, in order to form a cylindrical capacitor, a fourth silicon oxide film is formed by a CVD method with a film thickness corresponding to the height of the capacitor to be formed. Hole patterns of the capacitors are formed by etching with a photolithography method. The capacitors are designed as largely as possible, but so as not to be in contact with the adjacent capacitors.

A thin polysilicon film is formed by a CVD method over the entire surface including holes of the fourth silicon oxide film. Thereafter, the polysilicon film is selectively removed by an etch-back method to leave the polysilicon film only in the holes, thereby forming a cylindrical electrode (a lower electrode of the capacitor) 630.

Figure 6:
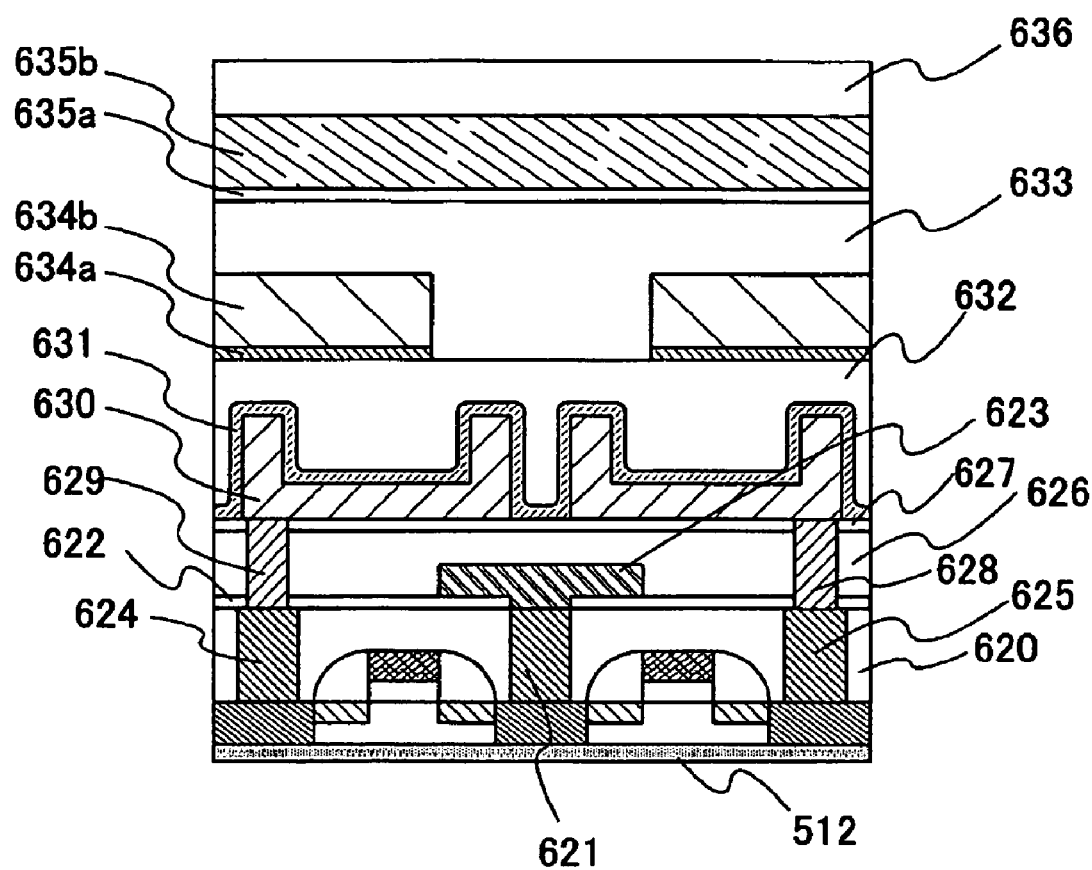
FIG. 6 is a cross-sectional view of a DRAM using a SIMOX substrate.

In addition, the present invention is not limited to the structure of a memory cell shown in FIG. 6 and a planar type, a stacked type, a trench type may be adopted, for example.

A $Ta_2O_5$ film and a TiN film are formed by a CVD method, and patterned to form an upper electrode (also referred to as a plate) 631 made of a TiN film. Through the above steps, a memory cell is completed. Further, $BaSrTiO_3$, $Si_3N_4$, or $SiO_2$ can be used as a substitute derivative for the $Ta_2O_5$ $_{film}$.

A first interlayer insulating film 632 and a second interlayer insulating film 633 is formed, and a CMOS circuit (not shown) formed in the periphery is connected by first and second wirings. The upper and lower wirings are electrically connected to each other by forming the contact hole and the plug.

The CMOS circuit is connected by the first and second wirings. As shown in FIG. 6, only the first and second wirings cross over the memory array. A wiring structure of three wirings, i.e., the bit line, the first wiring, and the second wiring is formed for a field effect transistor that is in the periphery.

The first wiring is formed with a structure in which a TiN film 634a, and a film 634b mainly containing Al are stacked. In addition, the second wiring is also formed with a structure in which a TiN film 635a, and a film 635b mainly containing Al are stacked.

Annealing is conducted in a hydrogen atmosphere to recover damages caused during the various steps. And a final protective film 636 including a silicon oxide film or a silicon nitride film is formed, and opening is conducted to expose the second wiring in only a bonding pad (a terminal portion connected to a package).

Lastly, the second single-crystal semiconductor layer 513 is ground to become thin. In this way, a DRAM, which a part of its structure is shown in FIG. 6, is formed.

Dicing is conducted to individually isolate chips having a DRAM from a wafer. Then, the chip is picked up from the wafer one by one, and mounted on a lead frame. An electrode terminal of the chip is electrically connected to an inner lead of the lead frame by a gold wire having a diameter of about 20 to 30 μm. Sealing is conducted using a mold resin layer for easy handling. The lead is plated with a solder to prevent the element from rusting. Thereafter, the chips are separated every individual package from the lead frame to form a lead. In this way, packaging is done.

Figure 7:
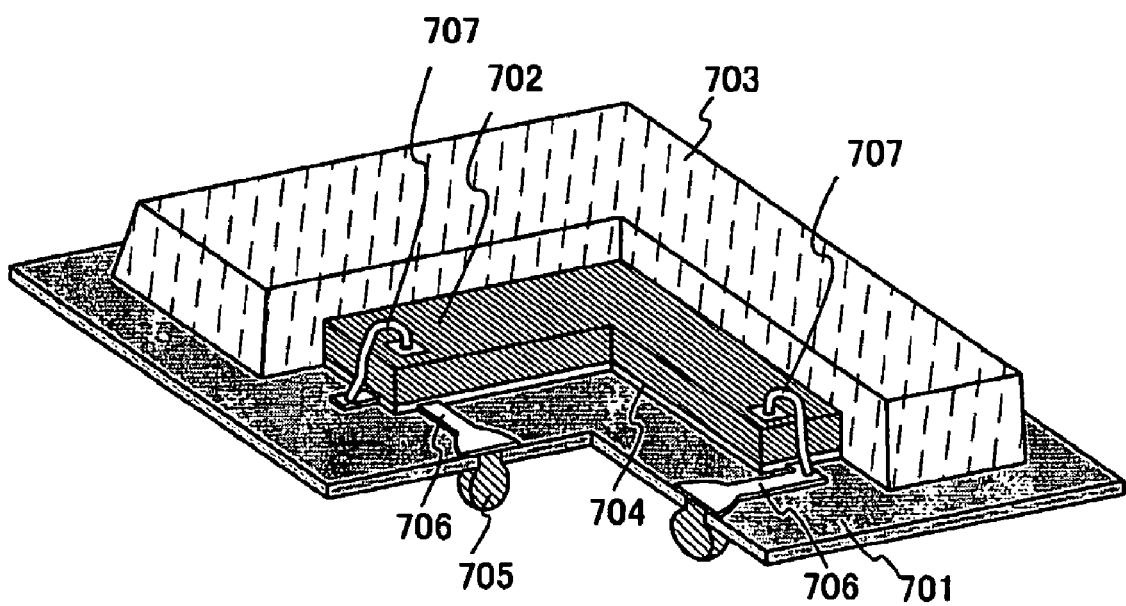
FIG. 7 is a perspective view showing a cross-sectional structure of a packaged device.

FIG. 7 is a perspective view showing a cross sectional structure of a packaged device. In the structure shown in FIG. 7, a chip 702 is connected to a lead frame 701 by a wire bonding method. In addition, the chip 702 is sealed with the mold resin layer 703. The chip 702 is mounted on the lead frame 701 by an adhesive agent 704 for mounting.

The lead frame 701 is a ball grid array type in which a solder ball 705 is provided. The solder ball 705 is formed on the opposite surface of the lead frame 701, to the surface provided with the chip 702. A wiring 706 provided in the lead frame 701 is electrically connected to the solder ball 705 via a contact hole provided in the lead frame.

In this embodiment mode, the wiring 706 for electrically connecting the chip 702 and the solder ball 705 is provided on the surface of the lead frame 701 provided with the chip; however, the lead frame is not limited to this structure. For example, a multilayer wiring may be formed inside the lead frame.

In FIG. 7, the chip 702 and the wiring 706 are electrically connected to each other by a gold wire 707. A semiconductor element is provided for the chip 702, and a pad is provided on the opposite surface of the chip 702, to the surface provided with the lead frame 701. The pad is electrically connected to the semiconductor element. The pad is electrically connected to the wiring 706 provided for the lead frame 701, by the gold wire 707.

This Embodiment Mode can be freely combined with Embodiment Mode 1 or Embodiment Mode 2.

Embodiment Mode 4

Various types of electronic devices can be completed by mounting an IC chip including an FET formed by a laser annealing method of the present invention. Further, an FET is formed as a switching element by a laser annealing method of the present invention, and a reflective electrode connected to the switching element is provided to form a reflective active matrix substrate. A display portion of an electronic device is formed using the reflective active matrix substrate. In this manner, various types of electronic devices can be manufactured.

As such electronic devices, personal computers, game machines, portable information terminals (such as mobile computers, cellular phones, portable game machines, or electronic books), cameras such as video cameras or digital cameras, reflective projectors, navigation systems, audio reproduction devices (such as car audio systems, car audio components), image reproduction devices provided with a memory medium (specifically, a device equipped with an IC chip, and a display by which the content of a memory medium such as a digital versatile disc (DVD) can be reproduced and the image can be displayed), and the like can be completed.

Figure 8A:
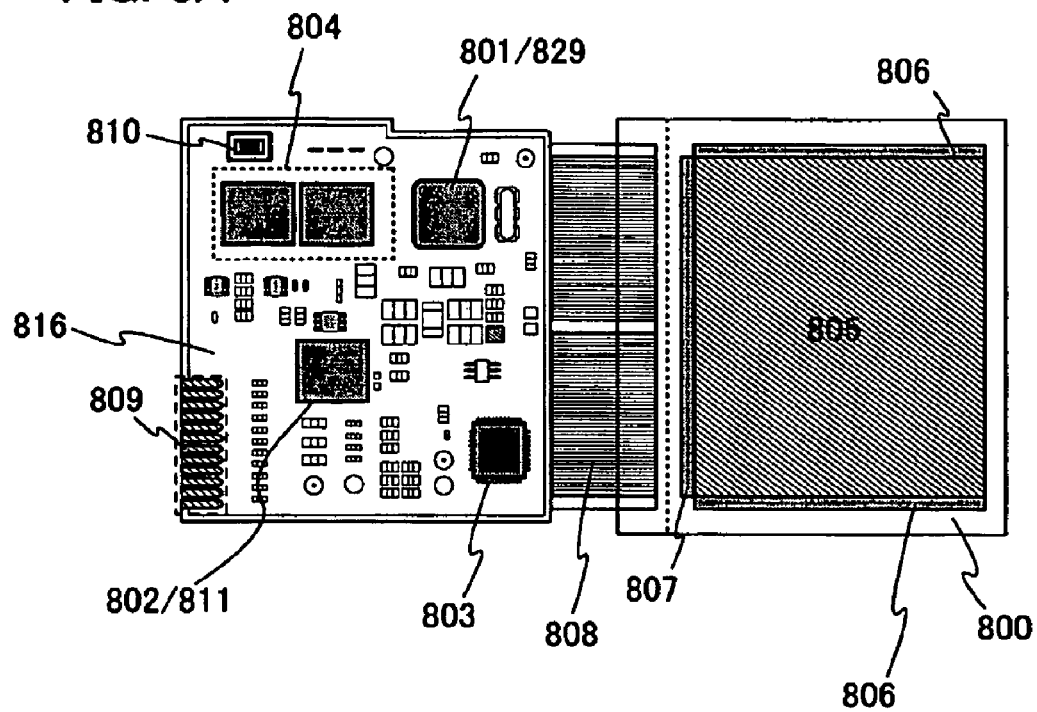
FIGS. 8A and 8B are each a top view of an example of mounting an IC chip of the present invention on a panel module.

A cellular phone which is one of electronic devices in the present invention is taken as an example. FIG. 8A shows how the electronic device is practically equipped with a package.

A module of the cellular phone shown in FIG. 8A includes a printed wiring board 816 mounted with a CPU 811 stacked over a memory 802, a power supply circuit 803, a controller 829 provided over an audio processing circuit 801, a transmitter-receiver circuit 804, and other elements such as a resistor, a buffer, and a capacitor. Moreover, a panel 800 is mounted on the printed wiring board 816 using an FPC 808. The panel 800 is provided with a pixel portion 805, a scan line driver circuit 806 for selecting a pixel included in the pixel portion 805, a signal line driver circuit 807 for supplying a video signal to the selected pixel.

Supply voltage to the printed wiring board 816 and various signals inputted with a key board are supplied through an interface portion 809 of the printed wiring board in which plural input terminals are disposed. Further, an antenna port 810 which transmits and receives signals between the printed wiring board and an antenna is provided for the printed wiring board 816.

In FIG. 8A, the printed wiring board 816 is mounted on the panel 800 by using an FPC. The present invention is not limited to this structure. A controller 829, a sound processing circuit 801, a memory 802, a CPU 811, or a power supply circuit 803 may be directly mounted on the panel 800 with a COG (Chip on Glass) method.

Further, in the printed wiring board 816, there is a case that capacitance formed between leading wirings and resistance of a wiring itself etc., cause noise to a supply voltage or a signal, or make a rise of a signal dull. Correspondingly, various kinds of elements such as a capacitor element and a buffer are provided over the printed wiring board 816, thereby preventing the noise to the supply voltage or the signal and the dull rise of the signal.

Figure 8B:
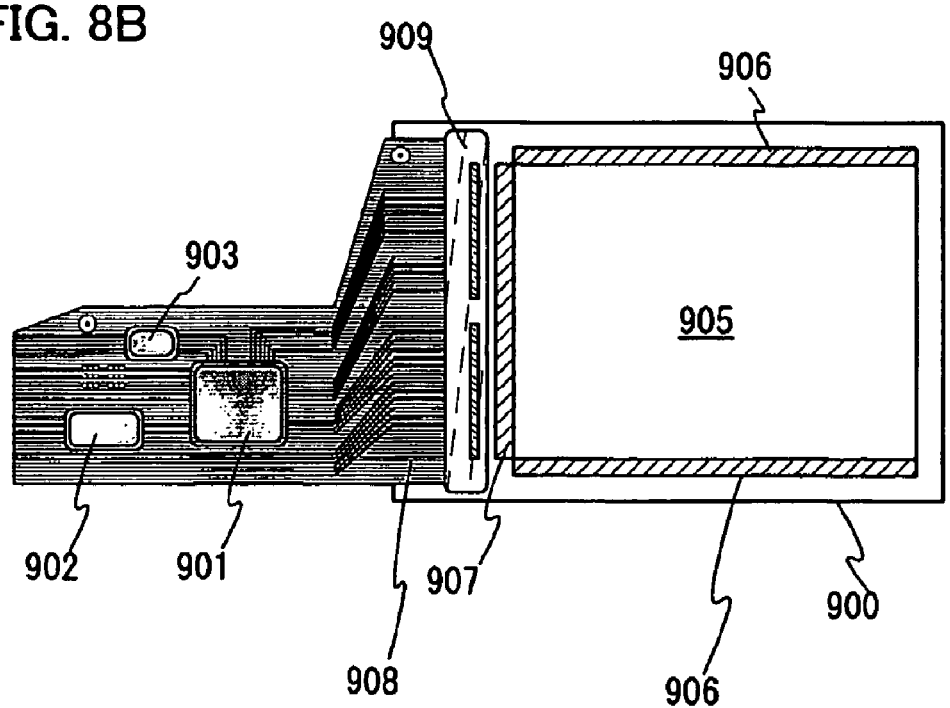

Further, FIG. 8B shows an example of a module equipped with an integrated circuit provided over an FPC.

As shown in FIG. 8B, integrated circuits (a controller 901, a CPU (central processing unit) 902, and a memory 903) are mounted over an FPC 908. A panel 900 is provided with a pixel portion 905 and driver circuits (such as a signal line driver circuit 907 and a scan line driver circuit 906), and an FPC 908 for connecting them to an external power or the like (not shown) which is provided outside is attached to the panel 900 with an adhesive agent 909. The integrated circuits (the controller 901, CPU 902, and memory 903) using a semiconductor substrate is mounted on the FPC 908; thus, the noise in the supply voltage or the signal and the dull rise of the signal are prevented.

Further, this embodiment can be freely combined with Embodiment Modes 1 to 3.

Embodiment Mode 5

An IC chip in which an FET formed by a laser annealing method of the present invention is integrated, can be used as a thin film integrated circuit or a noncontact thin film integrated circuit device (also referred to as a wireless IC tag or RFID (radio frequency identification)).

Figure 9:
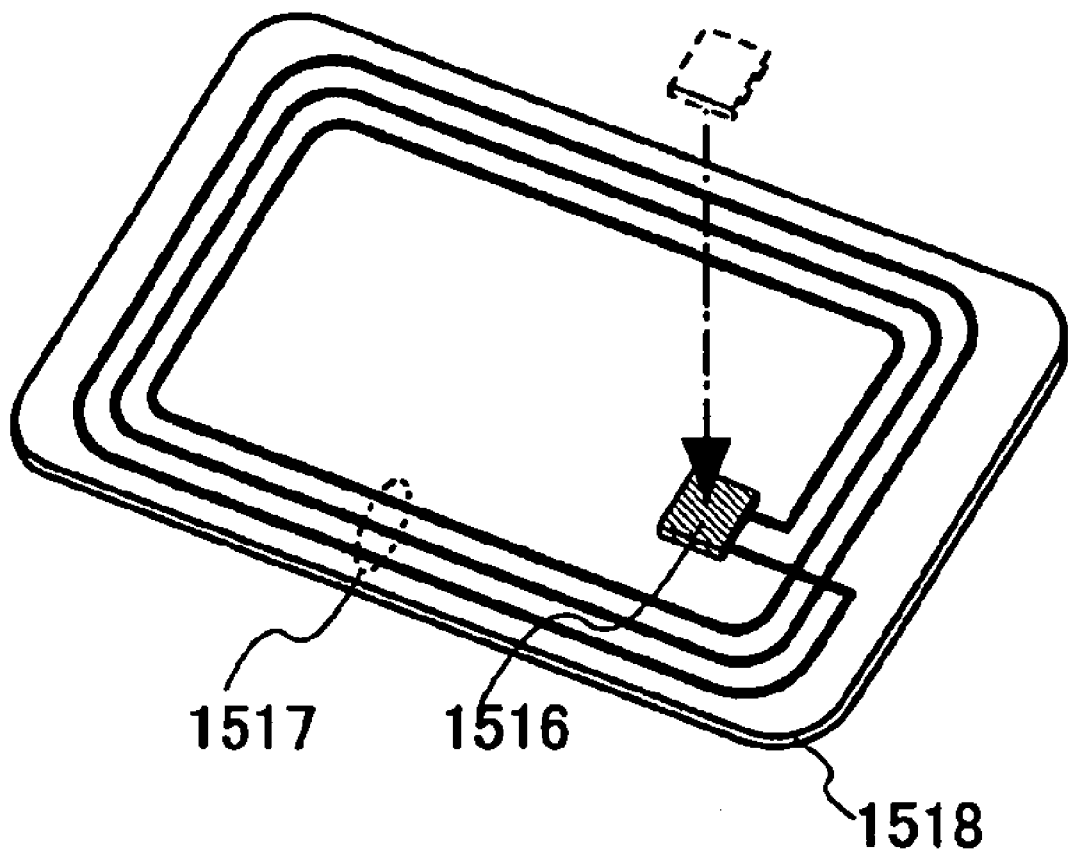
FIG. 9 is a top view of an example of mounting an IC chip of the present invention on a card.

FIG. 9 shows an example of an ID card in which an IC chip 1516 of the present invention is attached to a card-like substrate 1518 provided with a conductive layer 1517 which serves as an antenna. Thus, the IC chip 1516 of the present invention is small, thin, and lightweight, so that diverse uses can be realized and it does not spoil the design of an article even when it is attached to the article.

An IC chip 1516 of the present invention is not limited to the case of being attached to the card-like substrate 1518, and it can be attached to an article having a curved surface, or various shapes. For example, the IC chips can be used in bill, money, coin, securities, bearer bonds, certificates (such as a driver's license, or a resident's card, packing cases (such as a wrapper or a bottle), memory media (such as a DVD, a video tape), vehicles (such as a bicycle), belongings (such as a bag, or glasses), food, clothing, commodities, and the like.

This embodiment mode can be freely combined with Embodiment Mode 1 to 4.

Embodiment Mode 6

Various types of electronic devices can be formed by mounting an IC chip using an FET formed by a laser annealing method of the present invention. Specific examples thereof are described with reference to FIGS. 10A to 10E.

Figure 10A:
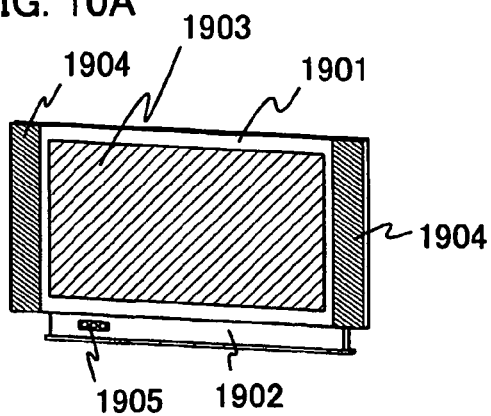
FIGS. 10A to 10E each shows an example of electronic devices.

FIG. 10A shows a display device including a casing 1901, a support 1902, a display portion 1903, speaker portions 1904, a video input terminal 1905 and the like. The display device is manufactured using an FET formed by the manufacturing method described in the above mentioned embodiment mode for a driver IC. As the display devices, liquid crystal display devices, light emitting devices and the like are given, and the category of such display devices includes all types of display devices for information display, for example, display devices for a computer, a TV receiving, and an advertising display.

Figure 10B:
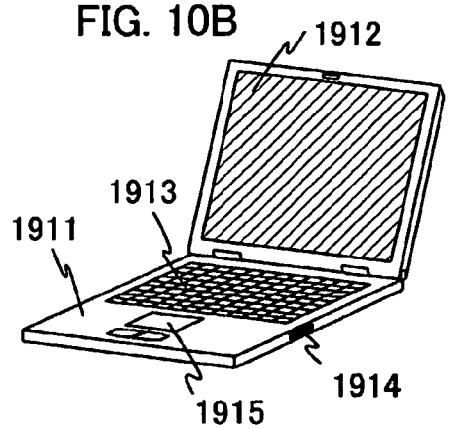

FIG. 10B shows a computer including a casing 1911, a display portion 1912, a keyboard 1913, an external connection port 1914, a pointing mouse 1915, and the like. By forming a FET with the manufacturing method shown in the above mentioned embodiment mode, the thus formed FET can be applied to a CPU or a memory inside the main body, and the like.

Figure 10C:
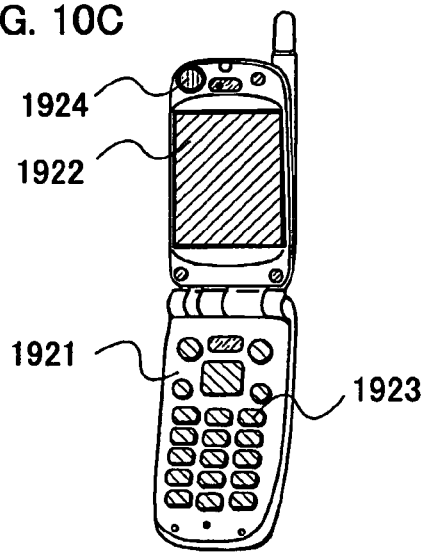

FIG. 10C shows a cellular phone, which is a typical example of mobile information terminal. The cellular phone includes a casing 1921, a display portion 1922, a sensor portion 1924, operation keys 1923, and the like. The sensor portion 1924 has an optical sensor element, and the amount of consumption current of the cellular phone can be suppressed by controlling the brightness of the display portion 1922 based on the illumination intensity obtained by the sensor portion 1924, or by conducting the lighting control of the operation keys 1923 corresponding to the illumination intensity obtained by the sensor portion 1924. In addition, in the case of a cellular phone having an imaging function such as a CCD or the like, whether a person who takes a picture looks in an optical finder or not is detected, as the amount of light changes, which is received by a sensor of the sensor portion 1924 provided in the vicinity of the optical finder. In the case where a person who takes a picture looks in the optical finder, the amount of electric power consumption can be suppressed by making off the display portion 1922.

The display screen of an electronic device such as the above mentioned cellular phone, a PDA (Personal Digital Assistants), a digital camera, or a compact game machine, is small, since these electronic devices are each a mobile information terminal.

Therefore, by forming functional circuits such a CPU, a memory, a sensor with using an FET shown in the above mentioned embodiment mode, electronic devices can be smaller and lighter.

Figure 10D:
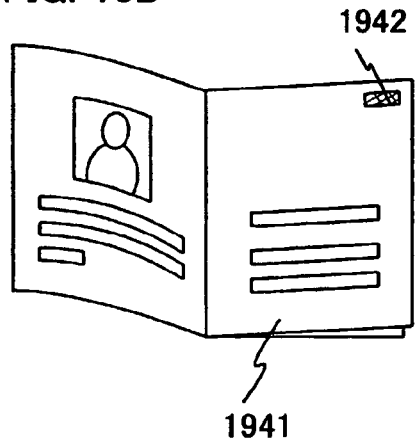

Moreover, distribution route of electronic devices can be made clear by attaching IC tags to various types of electronic devices. FIG. 10D shows a state in which a wireless IC tag 1942 is attached to a passport 1941. The wireless IC tag may be embedded in the passport 1941. In the same manner, the wireless IC tag can be attached to or embedded in driver's licenses, credit cards, bills, coins, securities, gift certificates, tickets, traveler's checks (T/C), insurances, residence certificates, family registers, and the like. In this case, only the information showing the real one is inputted into the wireless IC tag and an access right is set to prevent illegal reading or writing of information. This can be realized by using a memory shown in another embodiment mode. By using such a tag in this manner, it is possible to distinguish a counterfeit from the real one.

Figure 10E:
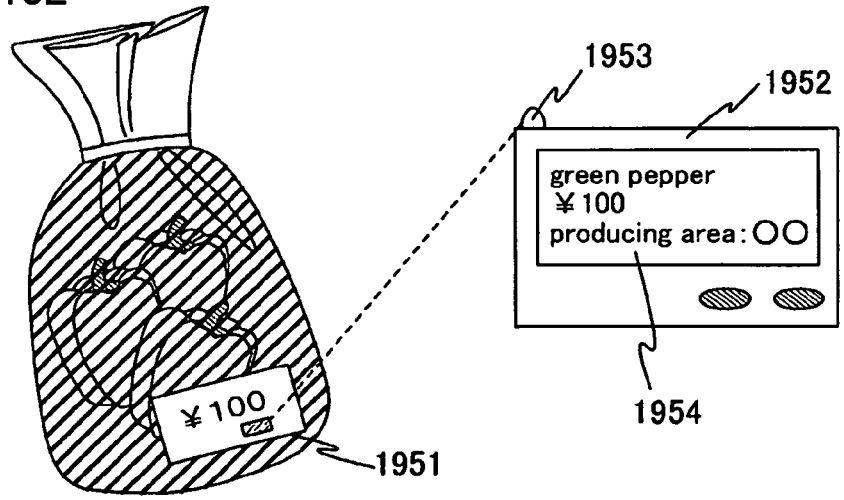

In addition to the above, the wireless IC tag can also be used as a memory. FIG. 10E shows an example in which the wireless IC tag 1951 is attached to a label attached to a vegetable wrapping. Also, the wireless IC tag may be attached to or embedded in the wrapping itself. The wireless IC tag 1951 can record process of commodity circulation, price, numerical quantity, use application, shape, weight, expire date, various identification information, etc, and stages of a production process such as place of production, producer, date of manufacture, processing method, etc. The information from the wireless IC tag 1951 is read by receiving it with an antenna portion 1953 of a reader 1952, and displaying the information on a display portion 1954 of the reader 1952. Thus, the information can be easily known by a dealer, a retail seller, and a consumer. In addition, by providing the access right to each producer, trader, and consumer, it is set so that a person who does not have an access right cannot read, write, change or erase information.

Further, the wireless IC tag can be used as follows. In stores, the information that payment has been made is written in the wireless IC tag, and whether payment has been made or not is checked at a provided checking device at an entrance. If people leave the stores without payment, an alarm rings. By this method, forgetting payment or shoplifting can be prevented.

In considering the privacy protection of customers, the following methods are possible. Either of the methods is employed when the payment is made: (1) the data inputted in the wireless IC tag is locked with a code number etc.; (2) the data itself inputted in the wireless IC tag is encrypted; (3) the data inputted in the wireless IC tag is erased; or (4) the data inputted in the wireless IC tag is destroyed. These methods can be realized by using a memory described in the above described embodiment modes. A checking device is provided at an entrance, and whether or not either of the processes (1) to (4) is conducted, or whether nothing is done in the data in the wireless IC tag is checked, in order to check whether payment has been made. In this manner, it is possible to check whether payment has been made in stores, and it can prevent the information in the wireless IC tag from being read without the holder's intention outside of stores.

According to the present invention, a short channel effect can be suppressed and further miniaturization can be done; therefore, an IC chip provided for a wireless IC tag can be miniaturized. As IC chips become smaller, the strength against impacts is more increased. Thus, the reliability of IC chips is enhanced. By a laser annealing method of the present invention, all types of wireless IC tags can be formed with high quality and without variations in performance.

As described above, the application range of a semiconductor device manufactured according to the present invention is extremely wide, and a semiconductor device formed according to the preset invention can be applied to electronic devices in various fields.

The present invention can be freely combined with Embodiment Modes 1 to 5.

INDUSTRIAL APPLICABILITY

According to the present invention, a non-linear optical device for converting a wavelength is not needed, and a laser beam having an extremely high output power can be used for activation. Accordingly, the width of a region which can be activated by one-time laser scanning can be made larger, and thus the productivity can be increased dramatically.

According to the present invention, a semiconductor integrated circuit can be more miniaturized and thus, high integration of an IC can be developed. In addition, according to the present invention, the number of chips which are obtained from one wafer can be increased.

EXPLANATION OF REFERENCE

101: laser oscillator, 102: slit, 103: mirror, 104: first cylindrical lens, 105: second cylindrical lens, 106: semiconductor substrate, 107: substrate fixing stage, 108: X stage, 109: Y stage, 110: laser beam, 111: beam irradiation region, 201: p-channel FET, 202: n-channel FET, 301: substrate, 302: n-well, 303: p-well, 306: field oxide film, 307: extension region, 308: source region, 309: drain region, 310: gate insulating film, 311: gate electrode, 311a: polysilicon layer, 311b: suicide layer, 312: sidewall, 313: extension region, 314: source region, 315: drain region, 316: gate insulating film, 317: gate electrode, 317a: polysilicon layer, 317b: suicide layer, 318: sidewall, 331: first interlayer insulating film, 332: second interlayer insulating film, 333: source electrode, 334: drain electrode, 335: source electrode, 336: drain electrode, 341: passivation film, 342: third interlayer insulating film, 510: SIMOX substrate, 511: first single-crystal semiconductor layer, 512: insulating layer, 513: second single-crystal semiconductor layer, 514: layer including second element, 515: grinding and polishing apparatus, 516: semiconductor device, 614: inorganic insulating film, 615: gate insulating film, 616: gate electrode, 617a: first impurity region, 617b: first impurity region, 618: sidewall, 619: second impurity region, 620: first silicon oxide film, 621: leading terminal, 622: second silicon oxide film, 623: bit line, 624: plug, 625: plug, 626: third silicon oxide film 627: silicon nitride film, 628: plug, 629: plug, 630: electrode, 631: upper electrode, 632: first interlayer insulating film, 633: second interlayer insulating film, 634a: TiN film, 634b: film mainly containing Al, 635a: TiN film, 635b: film mainly containing Al, 636: final protective film, 701: lead frame, 702: chip, 703: mold resin layer, 704: adhesive agent, 705: solder ball, 706: wiring, 707: gold wire, 800: panel, 801: sound processing circuit, 802: memory, 803: power supply circuit, 804: transmitter-receiver circuit, 805: pixel portion, 806: scan line driver circuit, 807: signal line driver circuit, 808: FPC, 809: interface portion, 810: antenna port, 811: CPU, 816: printed wiring board, 829: controller, 900: panel, 901: controller, 902: CPU, 903: memory, 905: pixel portion, 906: scan line driver circuit, 907: signal line driver circuit, 908: FPC, 909: adhesive agent, 1516: IC chip, 1517: conductive layer, 1518: card-like substrate, 1901: casing, 1902: support, 1903: display portion, 1904: speaker portion, 1905: video input terminal, 1911: casing, 1912: display portion, 1913: keyboard, 1914: external connection port, 1915: pointing mouse, 1921: casing, 1922: display portion, 1923: operation key, 1924: sensor portion, 1941: passport, 1942: wireless IC tag, 1951: wireless IC tag, 1952: reader, 1953: antenna portion, 1954: display portion

The invention claimed is:

1. A manufacturing method of a semiconductor device, comprising the steps of:
forming a gate electrode over a semiconductor substrate;
selectively injecting first impurities into the semiconductor substrate to form a first impurity region;
processing a first laser beam having a fundamental wave into a long beam on a surface of the first impurity region;
moving the surface of the first impurity region relatively to the long beam to scan the first laser beam to activate the first impurity region,
forming a sidewall on a side of the gate electrode after activating the first impurity region;
selectively injecting second impurities into the semiconductor substrate more deeply than the first impurities to form a second impurity region after forming the sidewall;
activating the second impurity region by a second laser beam,
wherein the first laser beam having a fundamental wave is oscillated with a pulse width of 1 femtosecond or more and 10 picoseconds or less.

2. A manufacturing method of a semiconductor device, comprising the steps of:
forming a gate insulating film over a semiconductor layer of an SOI substrate;
forming a gate electrode over the gate insulating film;
selectively injecting first impurities into the semiconductor layer of the SOI substrate to form a first impurity region;
processing a first laser beam having a fundamental wave into a long beam on a surface of the first impurity region; and
moving the surface of the first impurity region relatively to the long beam to scan the first laser beam to activate the first impurity region,
forming a sidewall on a side of the gate electrode after activating the first impurity region;
selectively injecting second impurities into the semiconductor layer of the SOI substrate more deeply than the first impurities to form a second impurity region after forming the sidewall;
activating the second impurity region by a second laser beam,
wherein the first laser beam having a fundamental wave is oscillated with a pulse width of 1 femtosecond or more and 10 picoseconds or less.

3. The manufacturing method of a semiconductor device according to claim 1 or 2, wherein the second impurity region is source and drain regions of a field effect transistor.

4. The manufacturing method of a semiconductor device according to claim 1 or 2, wherein the first impurity region is an extension region of a field effect transistor.

5. The manufacturing method of a semiconductor device according to claim 1 or 2, wherein the first laser beam having a fundamental wave is emitted from one kind of lasers in which one or more of Nd, Yb, Cr, Ti, Ho and Er, is/are added as a dopant into a crystal of Sapphire, YAG, ceramics YAG, ceramics $Y_2O_3$, KGW, KYW, $Mg_2SiO_4$, YLF, $YVO_4$, or $GdVO_4$.

6. The manufacturing method of a semiconductor device according to claim 1 or 2, wherein the first laser beam is pulsed laser light with a repetition rate of 10 MHz or more.

7. The manufacturing method of a semiconductor device according to claim 1, wherein a peak output power of the first laser beam is 1 $GW/cm^2$ to 1 $TW/cm^2$.

8. The manufacturing method of a semiconductor device according to claim 1, wherein a wavelength band of the fundamental wave is from red ray to near-infrared ray.

9. The manufacturing method of a semiconductor device according to claim 2, wherein a peak output power of the first laser beam is 1 $GW/cm^2$ to 1 $TW/cm^2$.

10. The manufacturing method of a semiconductor device according to claim 2, wherein a wavelength band of the fundamental wave is from red ray to near-infrared ray.

11. The manufacturing method of a semiconductor device according to claim 2, wherein the second laser beam has an energy density of 0.1 to 1 $J/cm^2$.

* * * * *

UNITED STATES PATENT AND TRADEMARK OFFICE
CERTIFICATE OF CORRECTION

| | | |
|---|---|---|
| PATENT NO. | : 7,737,053 B2 | Page 1 of 1 |
| APPLICATION NO. | : 10/579239 | |
| DATED | : June 15, 2010 | |
| INVENTOR(S) | : Koichiro Tanaka et al. | |

It is certified that error appears in the above-identified patent and that said Letters Patent is hereby corrected as shown below:

At column 8, line 15, please change "$\frac{s}{L} = \frac{M1}{Ml}$" to -- $\frac{s}{L} = \frac{M1}{M2}$ --;

At column 8, line 17, please change "$\frac{1}{f} = \frac{1}{M1} + \frac{1}{Ml}$" to -- $\frac{1}{f} = \frac{1}{M1} + \frac{1}{M2}$ --;

At column 8, line 4, please change "/is the focal length" to --f is the focal length--;

At column 8, lines 7 and 8, please change "M1 is the distance between the first cylindrical lens 104 and the semiconductor substrate 106" to --M2 is the distance between the first cylindrical lens 104 and the semiconductor substrate 106--;

At column 9, lines 10-11, please change "$D_F=K_T/PC_p$, wherein $K_T$ represents thermal conductivity, p represents density" to --$D_F=K_T/\rho C_p$, wherein $K_T$ represents thermal conductivity, $\rho$ represents density--;

At column 9, line 13, please change "density p of" to --density $\rho$ of--;

At column 9, line 39, please change "suicide" to --silicide--;

At column 10, lines 10-11, please change "suicide" to --silicide--;

At column 10, lines 19-21, please change "suicide layers 311b and 317b can be formed of a material such as molybdenum suicide (MoSix), tungsten suicide (WSix), tantalum siliside (TaSix), or titanium suicide (TiSix)" to --silicide layers 311b and 317b can be formed of a material such as molybdenum silicide (MoSix), tungsten silicide (WSix), tantalum silicide (TaSix), or titanium silicide (TiSix)--;

At column 19, line 14, please change "suicide" to --silicide--;

At column 19, line 16, please change "suicide" to --silicide--.

Signed and Sealed this
Twenty-third Day of August, 2011

David J. Kappos
*Director of the United States Patent and Trademark Office*